(12) United States Patent
Germunson (10) Patent No.: US 6,606,841 B1
(45) Date of Patent: Aug. 19, 2003

(54) TRAY LIFT MECHANISM

(75) Inventor: Gary G. Germunson, Yakima, WA (US)

(73) Assignee: Yakima Packaging Automation, Inc., Yakima, WA (US)

( * ) Notice: Subject to any disclaimer, the term of this patent is extended or adjusted under 35 U.S.C. 154(b) by 0 days.

(21) Appl. No.: 09/516,821

(22) Filed: Mar. 1, 2000

(51) Int. Cl.[7] .................................................. B65B 3/24
(52) U.S. Cl. ........................... 53/475; 53/52; 53/544; 294/27.1; 414/319; 414/320; 901/30
(58) Field of Search ...................... 901/30; 294/27.1; 83/475, 52, 540, 544; 414/319, 320, 744.8, 795.2; 409/184–185

(56) References Cited

U.S. PATENT DOCUMENTS

| | | | |
|---|---|---|---|
| 4,553,375 A | | 11/1985 | DeSantis |
| 4,569,183 A | | 2/1986 | DeSantis |
| 4,609,091 A | * | 9/1986 | Dorner ................... 198/347.3 |
| 4,650,640 A | | 3/1987 | Lahr et al. |
| 4,702,660 A | | 10/1987 | Niehaus et al. |
| 4,756,870 A | | 7/1988 | Lahr et al. |
| 4,761,876 A | * | 8/1988 | Kosmowski ................... 483/1 |
| 4,778,329 A | | 10/1988 | Phillips |
| 4,955,656 A | | 9/1990 | Krogstrup et al. |
| 5,038,549 A | | 8/1991 | Nordstrom |
| 5,176,494 A | | 1/1993 | Nigrelli et al. |
| 5,287,679 A | | 2/1994 | Dall'Omo |
| 5,331,788 A | | 7/1994 | Cinotti |
| 5,465,550 A | | 11/1995 | Dall'Omo |
| 5,473,978 A | * | 12/1995 | Colombo ................... 198/347.1 |
| 5,477,597 A | * | 12/1995 | Catania et al. ............... 29/34 B |
| 5,528,882 A | | 6/1996 | Yamamoto |
| 5,531,563 A | | 7/1996 | Willis |
| 5,669,602 A | | 9/1997 | Ito |
| 5,690,467 A | | 11/1997 | Smith |
| 5,787,680 A | | 8/1998 | Tisma et al. |
| 6,059,517 A | * | 5/2000 | Begin ........................ 294/1.1 |
| 6,098,379 A | * | 8/2000 | Spatafora et al. ......... 414/788.9 |

* cited by examiner

Primary Examiner—Eugene Kim
Assistant Examiner—Christopher Harmon
(74) Attorney, Agent, or Firm—Davis Wright Tremaine LLP; Michael J. Donohue (57) ABSTRACT

An apparatus for automatically loading trays includes a servo motor that is mechanically coupled to a plurality of elongated engagement members. The engagement members are coupled to the servo motor at a first end and include engagement elements at the second end of the engagement member. The engagement elements may be designed to uniquely operate with the type of tray to be lifted by the apparatus. In one embodiment where the apparatus is loading a disposable tray, the engagement member may be an auger-type bit that screws into the trays. The apparatus also includes a lifting mechanism by which the engagement assembly is vertically positioned. The apparatus mechanically engages and retains the tray and moves the tray into position over a carton or other shipping container. The apparatus is vertically displaced to lower the tray into the carton and the servo motor operated in a reverse direction to mechanically disengage the tray. The process may be repeated to automatically load a plurality of trays into a shipping container.

24 Claims, 6 Drawing Sheets

TRAY LIFT MECHANISM

TECHNICAL FIELD

The present invention is directed generally to lifting mechanisms and, more particularly, to a method and apparatus for engaging and lifting trays and loading the trays into a shipping container.

BACKGROUND OF THE INVENTION

Many repetitive tasks have been automated to reduce labor costs and to increase efficiency of manufacturing. For example, assembly lines often are designed to lift components of an article of manufacture and move the components to a position where the components are incorporated into the article of manufacture. One example of such automation is an automobile assembly line where components of the automobile are automatically lifted and positioned along the assembly line at a location where the various components will be added to the automobile under assembly.

In other circumstances, components may not be easily moved through automatic means. For example, trays of components must be carefully lifted and moved so as not to tip over the trays and drop the components. One such mechanism for lifting trays of components is illustrated in U.S. Pat. No. 5,690,467, which is designed to lift trays of electrical components. As described in that patent, a lifting mechanism grasps the tray from the side and has hydraulically controlled pawls that extend underneath the tray to provide the necessary lifting capability. While such an approach is useful for lifting trays of components, this mechanism does not lend itself to an automated process for loading the trays of components into a carton or other shipping container. In a desired loading operation, the trays are sized to fit in the carton without excessive room in the carton such that the trays would shift from side to side. However, the requirements of a snug fit between the side of the tray and the carton makes the system described in the above-referenced patent unfeasible since excess room would be required in the carton to allow the lifting pawls to engage the tray at its sides.

Therefore, it can be appreciated that there is a significant need for an apparatus and method that would allow trays to be lifted and automatically placed in a carton or shipping container. The present invention provides this and other advantages as will be described by the following detailed description and accompanying figures.

SUMMARY OF THE INVENTION

The present invention is embodied for loading trays and comprises a motor and a drive mechanism coupled to the motor. A plurality of rotatable engagement members is coupled to the drive mechanism and rotated in a first direction in response to motor movement in a first direction. The engagement members engage and retain a tray when rotated in the first direction. A lift mechanism raises and lowers the engagement members after the engagement members have engaged and retained the tray to thereby move the tray.

In one embodiment, the engagement members have an auger-shaped member to engage and retain the tray. The system also includes position detectors to control the positioning of the elements. A limit sensor may be positioned proximate the drive system to detect movement thereof and to allow a predetermined amount of rotational movement of the engagement members. A limit sensor may also be positioned proximate the lift mechanism to determine vertical movement thereof to allow a predetermined amount of vertical movement of the engagement members. In one embodiment, a computer control system is preprogrammed with data relating to the size of the trays and uses the data to determine the amount of vertical movement of the engagement members to deposit a tray into a shipping carton.

DETAILED DESCRIPTION OF THE INVENTION

The present invention is directed to a technique for engaging, lifting, and depositing trays in a shipping container or carton. The system operates by providing a plurality of engagement members that screw into the tray to engage and retain the tray.

Figure 1:
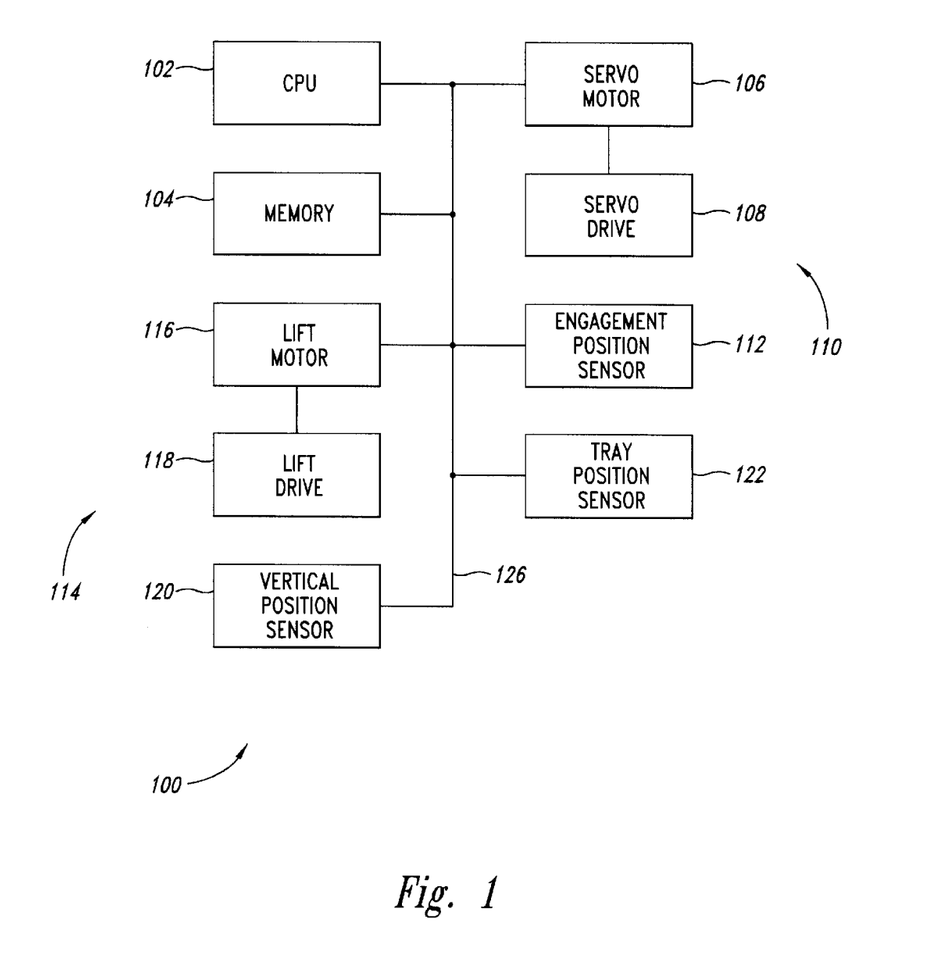
FIG. 1 is a functional block diagram illustrating the components of the present invention.

The present invention is embodied in a system 100 whose control elements are illustrated in the functional block diagram of FIG. 1. The system 100 includes a central processing unit (CPU) 102 and a memory 104. Although the CPU 102 and memory 104 may be implemented as part of a personal computer (PC), those skilled in the art will recognize that the CPU 102 and memory 104 may be provided in the form of a microcontroller, microprocessor, programmable logic array (PLA) or other conventional computer control device. The present invention is not limited by the specific form in which the control elements are implemented.

In general, the CPU 102 receives and executes instructions provided by the memory 104. The memory 104 may include random access memory (RAM), read-only memory (ROM), and a basic input/output system (BIOS). The operation of these various forms of the memory 104 are well known in the art and need not be described in greater detail herein. The memory 104 provides instructions and data to the CPU 102 which, in turn, executes the instructions and processes the data in a manner such as described below.

The system 100 also includes a servo motor 106 and a servo drive 108. The servo motor 106 and servo drive 108 are part of an engagement assembly 110, which mechanically engages and retains the tray of components. As will be discussed in greater detail below, the servo motor 106 operates under control of the CPU 102 and is typically coupled to the CPU 102 via an interface (not shown). Upon receipt of commands from the CPU 102, the servo motor 106 activates and causes movement of the servo drive 108 to engage the tray. An engagement position sensor 112 may be used to provide feedback to the servo motor 106 directly, or via the CPU 102, to indicate when the system has engaged the tray.

The system 100 includes a lift assembly 114 that comprises a lift motor 116 and lift drive 118. When the system 100 has properly engaged a tray of components, the lift motor 116 is activated and the lift drive 118 operates to raise and lower the engaged tray with components. The lift motor 116 operates under instructions from the CPU 102 and is typically coupled to the CPU 102 via an interface (not shown). Motor control interfaces, such as may be used with the servo motor 106 and the lift motor 116, are well known in the art and need not be described in greater detail herein. A vertical position sensor 120 may provide feedback to the lift motor 116 so as to track the vertical position of the engagement assembly 110.

In a first operation, the lift assembly 114 operates to raise a tray of components. As will be described in greater detail below, the lift motor 116 operates in a first direction to raise the engagement assembly 110. In a reverse operation, which will also be described in greater detail below, the lift motor 116 operates in reverse direction to lower the engagement assembly and thus deposit the tray of components in a carton or other packing container. When the tray of components has been successfully placed in the carton, the servo motor 106 operates in a reverse manner to that described above to mechanically disengage the system 100 from the tray. Thereafter, the lift motor 116 operates to raise the engagement assembly 110 out of the carton thereby automatically completing a cycle in which the tray of components is mechanically engaged and lifted by the system, moved into position over a carton, lowered into the carton and disengaged from the system.

In addition to the engagement position sensor 112 and the vertical position sensor 120, the system 100 may also include a tray position sensor 122, which may provide an electrical input signal to the CPU 102 to indicate when a tray of components is in position and ready for engagement with the engagement assembly 110.

The various components described above are interconnected by a bus system 126. The bus system 126 may include a data bus, address bus, control bus, power bus, and the like. However, for the sake of simplicity, these various buses are illustrated in 10 FIG. 1 as the bus system 126.

Figure 2A:
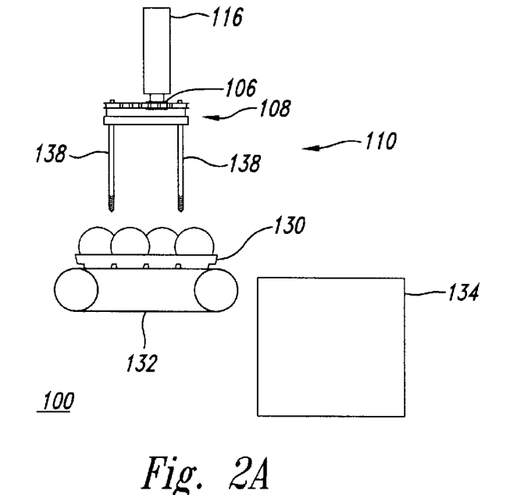
FIGS. 2A–2C are side views of the mechanical components of the present invention showing the process of the engagement and lifting of a tray.
Figure 2B:
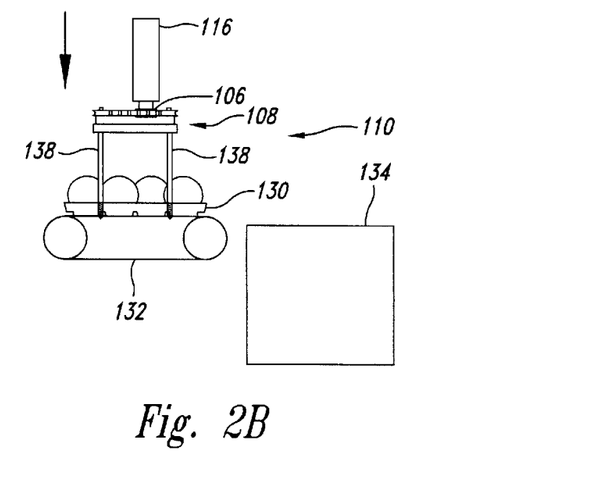
Figure 2C:
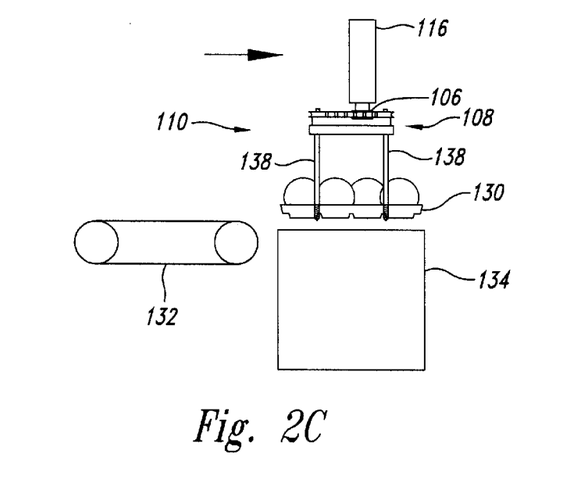

The process of engaging and lifting a tray of components is illustrated in FIGS. 2A–2C. While the following description illustrates the use of the invention for automatically loading trays of components from a loading area (e.g., a conveyor belt) into a container, the invention can also be used to perform the reverse process (i.e., unloading trays of components from a carton). In FIG. 2A, a tray 130 containing components is positioned under the system 100 by a conveyor 132 or other conventional positioning mechanism. The tray position sensor 122 may operate in conjunction with a conveyor belt drive mechanism (not shown) to temporarily halt the conveyor 132 when the tray 130 is properly positioned under the engagement assembly 110. A carton 134 or other shipping container is also moved into position proximate the system 100.

As noted above, the engagement assembly 110 includes the servo motor 106 and servo drive 108. In addition, the engagement assembly 110 includes a plurality of engagement members 138. Mechanical and operational details of the engagement members 138 are provided below. In FIG. 2B, the CPU 102 activates the lift motor 116 and lowers the engagement assembly 110 until the engagement members 138 contact the tray 130. The servo motor 106 is activated, which in turn operates the servo drive 108 to rotate the engagement members 138. The engagement members 138 screw into the tray 130 to mechanically engage and retain the tray. The engagement position sensor 112 (see FIG. 1) controls the amount of rotation of the engagement members 138. In one embodiment, the engagement position sensor 112 allows a predetermined number of revolutions of the engagement members 138 to allow the engagement members to screw into the tray 130. The engagement position sensor 112 may use a number of different known techniques to measure the number of revolutions of the engagement members 138. For example, the engagement position sensor 112 may be mounted in proximity with one of the engagement members 138 and use optical or magnetic detection means to determine the number of revolutions of that engagement member. Alternatively, the engagement position sensor 112 may be mounted in proximity with a drive chain 144 (see FIGS. 4–5) and measure linear displacement of the drive chain using, by way of example, optical measurement techniques or simply a mechanical stop-limit switch. The techniques used to measure displacement of the drive chain 144 or the number of revolutions of the engagement members 138 are known in the art and need not be described in greater detail herein.

In FIG. 2C, the engagement assembly 110 is displaced laterally such that the tray 130 is now positioned over the carton 134. Those skilled in the art will recognize that the system 100 may also lift the tray 130 if the height of the carton 134 is not suitably matched to the height of the conveyor 132. However, in a typical assembly line operation, the carton 134 is positioned proximate the system 100 and is positioned vertically to correspond to the vertical position of the conveyor 132 and thus the tray 130. Although not described in detail, the lateral movement of the engagement assembly 110 may be controlled via a separate motor (not shown) or may be controlled by other conventional means, such as a hydraulic system.

Figure 3A:
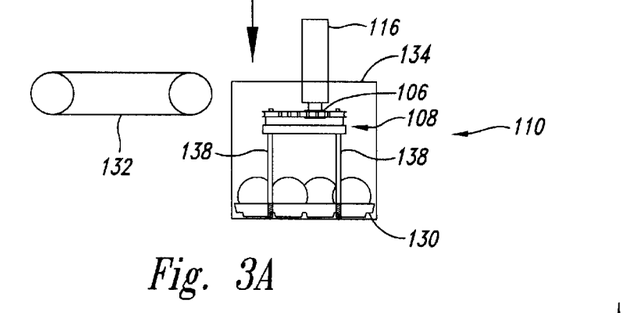
FIGS. 3A–3C are a side view of the mechanical components of the present invention showing the process of depositing a tray into a carton.
Figure 3B:
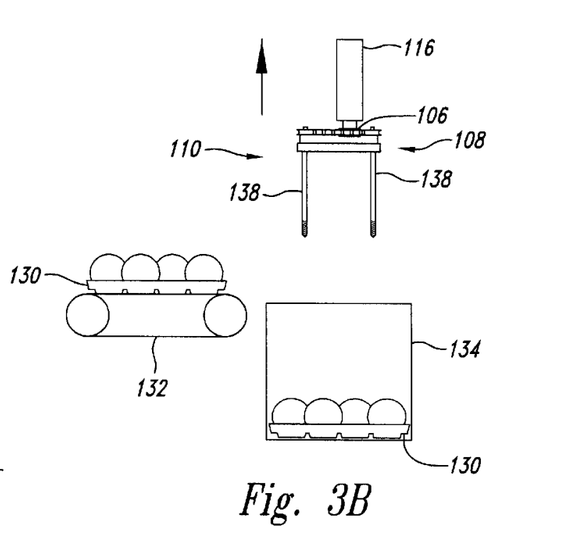
Figure 3C:
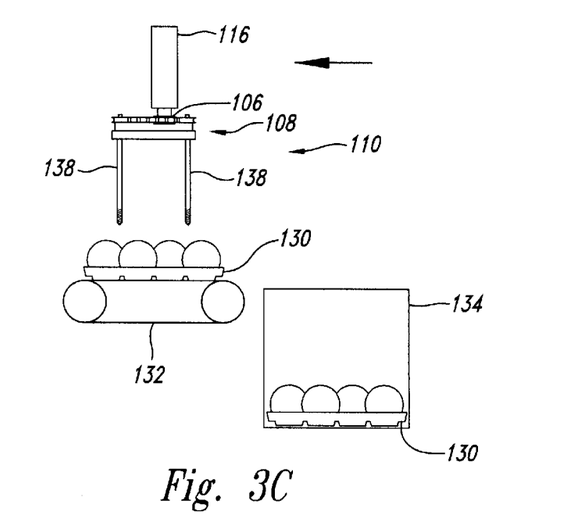

The operation of the system 100 to lower the tray into the carton and disengage therefrom is illustrated in FIGS. 3A–3C. In FIG. 3A, the CPU 102 (see FIG. 1) activates the lift motor 116 to lower the engagement assembly 110 and tray 130 into the carton 134. The vertical position sensor 120 is used to indicate to the system 100 how far to lower the tray into the carton. In a typical loading operation, a number of trays may be stacked on top of each other in the carton 134. In one embodiment, the CPU 102 may be preprogrammed with data indicative of the height of each tray. In this embodiment, the vertical position sensor 120 merely tracks the number of trays that have previously been loaded into the carton. The CPU 102 calculates how far the tray 130 must be lowered into the carton 134 based on the number of trays previously loaded into the carton. Alternatively, the vertical position sensor 120 may include a sensor element (not shown), such as a mechanical switch or optical detector, to determine when the tray 130 has been lowered to the proper position in the carton 134.

When the tray 130 is in the proper position in the carton 134, the lift motor 116 is temporarily deactivated and the servo motor 106 is activated in the reverse direction to that described above with respect to FIG. 2B. By rotating in the reverse direction, the servo drive 108 causes the engagement members 138 to unscrew from the tray 130 and thereby mechanically disengage from the tray. When disengagement is completed, the CPU 102 deactivates the servo motor 106.

At this point, the tray 130 has been loaded into the proper position within the carton 134 and is disengaged from the engagement assembly 110.

In FIG. 3B, the CPU 102 activates the lift motor 116 to withdraw the engagement assembly 110 from the carton 134. FIG. 3B also illustrates that a new tray 130 has been moved into the proper position on the conveyor 132. In FIG. 3C, the system 100 is laterally displaced such that the engagement assembly 110 is now positioned over the new tray 130. The process described above is repeated for the new tray 130 until the carton 134 has been fully loaded. Thus, the system 100 fully automates the tray loading process and may readily be operated with trays of varying size and height.

Figure 4:
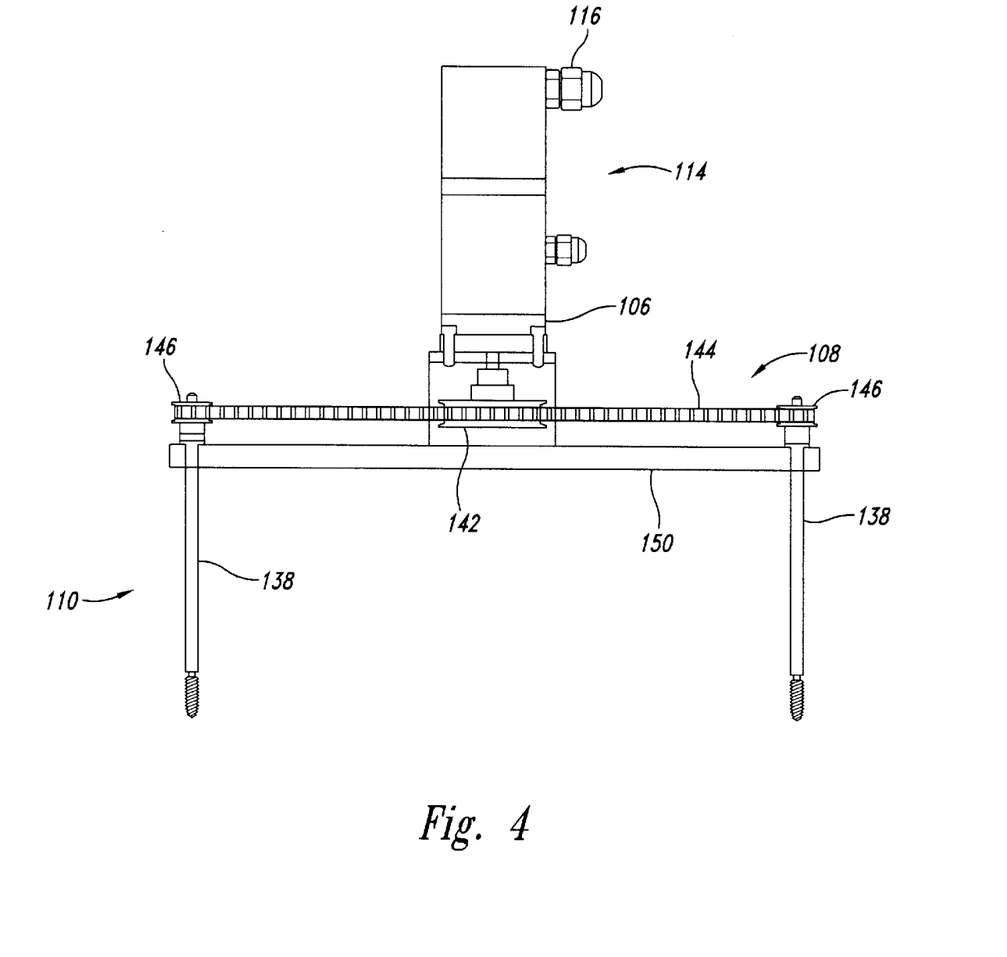
FIG. 4 is a side cross-sectional view of the mechanical components of the present invention.
Figure 5:
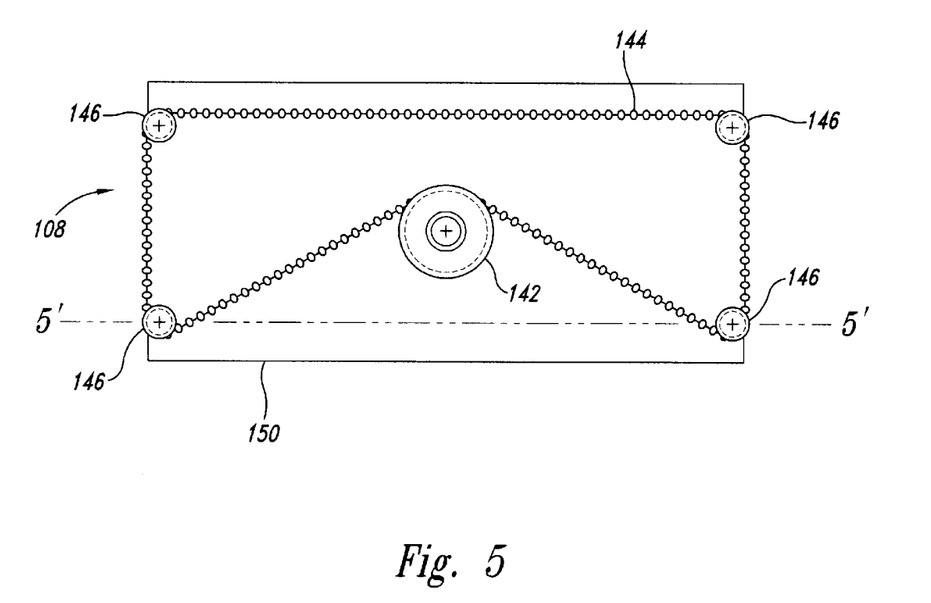
FIG. 5 is a top plan view of the mechanical components of FIG. 4.

Details of the engagement assembly 110 are provided in FIGS. 4 and 5. FIG. 4 is a front cross-sectional elevational view illustrating the servo motor 106 and the servo drive 108. As illustrated in FIG. 4, the servo drive 108 may comprise a drive gear 142 coupled to the servo motor 106 and a drive chain 144. The drive gear 142 may be coupled to the shaft of the servo motor 106 using set screws or other conventional components. The drive chain 144 moves along a pathway defined by the drive gear 142 and a plurality of engagement member gears 146. The tension in the drive chain 144 may be adjusted by proper positioning of the drive gear 142, as is known in the art. Those skilled in the art will also recognize that the drive chain 144 may be replaced by other conventional drive mechanisms. For example, the drive chain 144 could be replaced by an automotive timing belt or a conventional belt. In this embodiment, the drive gear 142 and engagement member gears 144 would be replaced by conventional pulleys, such as commonly used in the automotive industry.

The engagement members 138 are inserted through and supported by a platform 150, shown in a cross-sectional view in FIG. 4, taken along the line 5–5' of FIG. 5. The platform is mounted to the lift assembly 114 by a bracket 152. The platform 150 provides stability for each of the engagement members 138.

FIG. 5 is a top elevational view of the engagement assembly 110. As best illustrated in FIG. 5, the system 100 contains four engagement members 138, each of which is coupled to a corresponding one of the engagement member gears 146. The engagement members 138 are spaced apart so as to engage the tray 130 (see FIGS. 2A–2C and FIGS. 3A–3C) in desired locations along the tray so as to provide acceptable stability when lifting the tray. However, those skilled in the art will recognize that more or fewer engagement members 138 may be satisfactorily used with the system 100.

Figure 6:
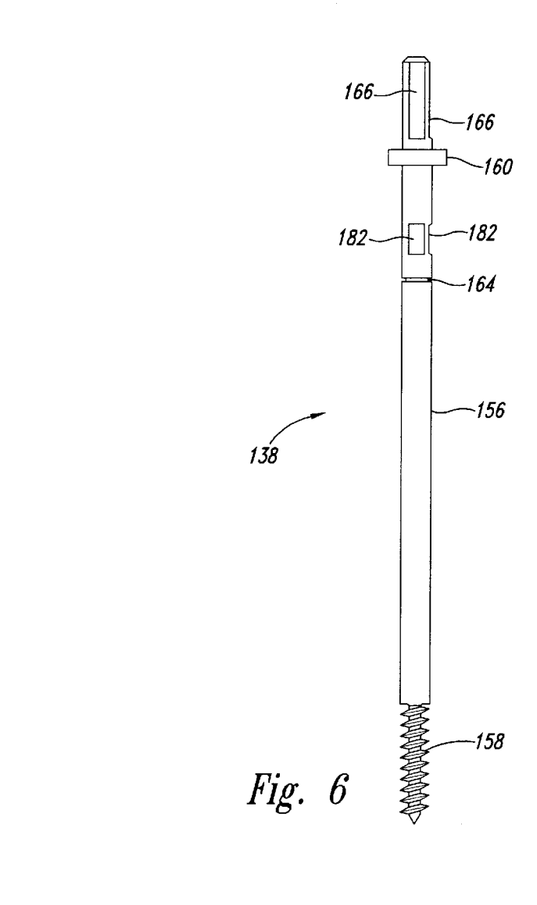
FIG. 6 is a side elevational view of an engagement member used to engage the tray of components.
Figure 7:
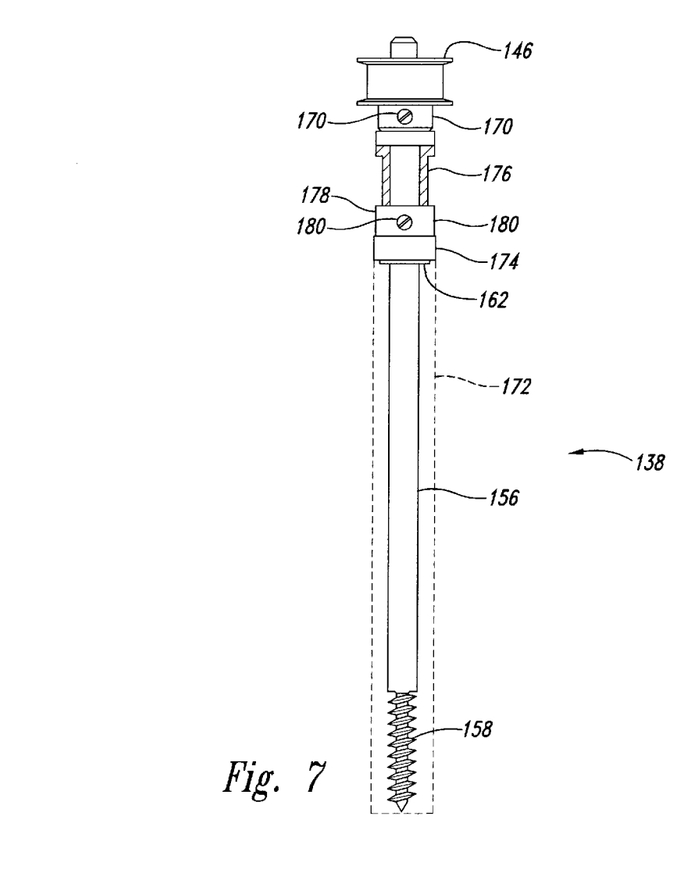
FIG. 7 is a side elevational view of the engagement member of FIG. 6 with additional drive components attached thereto.

Details of the engagement members are shown in FIGS. 6 and 7. The engagement member comprises an elongated shaft 156 having an engagement element 158 at a first end of the shaft. The engagement element 158 is illustrated in FIGS. 7 and 8 as an auger bit that is designed to drill into and retain the tray 130 (see FIGS. 2A–2C and FIGS. 3A–3C). Because the auger bits of the engagement element 158 drill directly into the tray, precise positioning of the tray is not required. The only requirement is that the auger bits of the engagement members 138 do not drill into the components stored on the tray.

In an alternative embodiment, the engagement element 158 may be a threaded rod to engage a corresponding threaded hole in the tray 130. The use of a threaded rod to engage threaded hole in the tray 130 requires more precise alignment between the engagement assembly 110 (see FIGS. 2A–2C and FIGS. 3A–3C) in the tray 130. However, the tray position sensor 122 (see FIG. 1) may provide a sufficient degree of accuracy in placement of the tray to allow sufficient accuracy in the alignment of the tray 130 in the engagement assembly 110.

The shaft 156 is retained within the platform 150 (see FIG. 4) by a collar 160 at a second end of the shaft, which is on a first side of the platform. A set collar 178 is mounted on the shaft 156 on the opposite side of the platform 150 from the collar 160 to retain the engagement members 138 in the platform. The set collar 178 includes set screws 180 to mount the set collar on the shaft 156. The shaft 156 includes flat mating surfaces 182 (see FIG. 7) to engage the set screws 180.

FIG. 7 illustrates a bushing 176 that may be press fit into the platform 150 to reduce friction as the engagement members 138 rotate. The bushing 176 is shown in a cross-sectional view in FIG. 7 to illustrate its placement with respect to the shaft 156. Those skilled in the art will recognize that the bushing 176 can be replaced by a bearing (e.g., a ball bearing) to further reduce friction as the engagement members 138 rotate.

The engagement gears 146 mount on the second end of the shaft 156 above the collar 160. The shaft 156 may conveniently have flat mating surfaces 166 (see FIG. 6) to mechanically engage set screws 170 on the engagement gears 146.

In one embodiment the objects on the tray 130 (see FIGS. 2A–2C and FIGS. 3A–3C) may be easily damaged. For example, the system 100 could be used to load trays of fruit, such as apples, that can be damaged if struck by the engagement members 138. The system may include a protective sleeve 172, shown in phantom form in FIG. 7, on each engagement member 138. The sleeve 172 is mounted on a bearing 174 and extends just beyond the terminal point of the engagement element 158. The sleeve 172 may be fixed to the bearing 174 by any convenient method, such as a hose clamp, cable tie, adhesive, or the like.

The bearing 174 is mounted on the shaft 156 and retained in place by a retaining ring 162, such as a C-ring, which is inserted into a groove 164 (see FIG. 6) on the shaft 156. The bearing 174 rotates freely about the shaft 156 so that the sleeve 172 does not rotate with the engagement member 138 and damage the objects on the tray 130 (see FIGS. 2A–2C and FIGS. 3A–3C). In an exemplary embodiment, the sleeve 172 is made of a compliant material, such as rubber, so that it will collapse when the engagement assembly 110 (see FIGS. 4–5) is brought into contact with the tray 130. Thus, the sleeve 172 protects the objects as the engagement assembly 110 is lowered into position above the tray 130 and further protects the objects as the engagement members 138 rotate since the sleeve does not rotate with the engagement members (due to the operation of the bearing 174).

In operation, the servo motor 106 rotates the engagement members 138 such that the auger bits engage and retain the tray 130 (see FIGS. 2A–2C and FIGS. 3A–3C). In one embodiment, the tray 130 is manufactured from a disposable material, such as cardboard. This embodiment may be conveniently used for transporting perishable items, such as apples or other produce. In this embodiment, the auger bit of the engagement member 158 drills directly into the cardboard tray 130 and mechanically engages and retains the tray. In another embodiment where the trays 130 are reusable, the auger bit of the engagement member 138 may be replaced with a threaded rod, as described above. Thus, the system 100 may be used with a variety of different trays and provide a fully-automated process for lifting trays of components and depositing them in a carton 134 or other convenient packing container.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A tray loading apparatus, comprising:

a motor;

a drive mechanism coupled to the motor;

a plurality of rotatable engagement members coupled to the drive mechanism and rotated to screw into a tray, thereby creating an aperture into which the engagement members extend to thereby engage and retain the tray; and a lift mechanism to raise and lower the engagement members after the plurality of engagement members have engaged and retained the tray to thereby move the tray.

2. The apparatus of claim 1 wherein the engagement members have an elongated shaped with first and second ends, the first end being coupled to the drive mechanism and the second end having an auger member to screw into and retain the tray.

3. The apparatus of claim 1, further comprising a limit sensor positioned proximate the drive mechanism to detect a predetermined amount of rotational movement of the engagement members and generating a stop signal in response thereto, the motor ceasing movement in the first direction in response to the stop signal.

4. The apparatus of claim 1, further comprising a limit sensor positioned proximate the lift mechanism to detect vertical movement of the engagement members, the limit sensor detecting a predetermined amount of vertical movement of the engagement members and generating a stop signal in response thereto, the lift mechanism ceasing vertical movement in response to the stop signal.

5. The apparatus of claim 1, further comprising a processor to determine the vertical displacement of the engagement members, the lift mechanism lowering the engagement members and tray a predetermined distance determined by the processor.

6. The apparatus of claim 5 wherein the processor is pre-programmed with data indicating a height of the trays and objects contained thereon, the lift mechanism lowering the engagement members and tray a predetermined distance determined by the processor using the pre-programmed data.

7. The apparatus of claim 5 for use in loading a plurality of trays into a container wherein the processor determines the predetermined distance based on a number of the plurality of trays that have previously been loaded into the container.

8. A tray loading apparatus, comprising:

a drive element;

a drive mechanism coupled to the drive element;

a plurality of rotatable screw engagement members coupled to the drive mechanism and rotated in a first direction in response to activation of the drive element in a first direction, the engagement members initially positioned out of contact with a tray; and a lift mechanism to lower the engagement members to permit the engagement members to screw into and retain the trays as the engagement members pass through the tray and to raise the engagement members and the retained tray after the engagement members have engaged and retained the tray.

9. The apparatus of claim 8 wherein the engagement members have an elongated shaped with first and second ends, the first end being coupled to the drive mechanism and the second end having an auger member to screw into and retain the tray.

10. The apparatus of claim 8, further comprising a limit sensor positioned proximate the drive mechanism to detect movement thereof, the limit sensor detecting a predetermined amount of rotational movement of the engagement members and generating a stop signal in response thereto, the drive element ceasing movement in the first direction in response to the stop signal.

11. The apparatus of claim 8, further comprising a limit sensor positioned proximate the lift mechanism to detect vertical movement thereof, the limit sensor detecting a predetermined amount of vertical movement of the engagement members and generating a stop signal in response thereto, the lift mechanism ceasing vertical movement in response to the stop signal.

12. The apparatus of claim 8, further comprising a processor to determine the vertical displacement of the engagement members, the lift mechanism lowering the engagement members and tray a predetermined distance determined by the processor.

13. The apparatus of claim 12 wherein the processor is pre-programmed with data indicating a height of the trays and objects contained thereon, the lift mechanism lowering the engagement members and tray a predetermined distance determined by the processor using the pre-programmed data.

14. The apparatus of claim 8, further comprising a controllable member to position a tray in a predetermined location with respect to the engagement members.

15. The apparatus of claim 14 wherein the controllable member is a conveyor.

16. The apparatus of claim 14, further comprising a position sensor to sense the position of the tray and to generate a signal when the tray is positioned in the predetermined location with respect to the engagement members.

17. A tray loading apparatus, comprising:

a drive element;

a drive mechanism coupled to the drive element;

a plurality of rotatable engagement members coupled to the drive mechanism; and a lift mechanism to move the engagement members in a line of travel wherein the engagement members rotate about the line of travel as the lift mechanism moves along the line of travel toward the tray to permit the engagement members to pass through the tray to thereby retain the tray, the lift mechanism moving along the line of travel away from the tray to thereby lift the tray retained by the engagement members.

18. The apparatus of claim 17, further comprising a limit sensor positioned proximate the drive mechanism to detect movement thereof, the limit sensor detecting a predetermined amount of rotational movement of the engagement members and generating a stop signal in response thereto, the drive element ceasing movement in the first direction in response to the stop signal.

19. The apparatus of claim 17, further comprising a limit sensor positioned proximate the lift mechanism to detect vertical movement thereof, the limit sensor detecting a predetermined amount of vertical movement of the engagement members and generating a stop signal in response thereto, the lift mechanism ceasing vertical movement in response to the stop signal.

20. The apparatus of claim 17, further comprising a processor to determine the vertical displacement of the engagement members, the lift mechanism lowering the engagement members and tray a predetermined distance determined by the processor.

21. The apparatus of claim 20 wherein the processor is preprogrammed with data indicating a height of the trays and objects contained thereon, the lift mechanism lowering the engagement members and tray a predetermined distance determined by the processor using the pre-programmed data.

22. The apparatus of claim 17, further comprising a controllable member to position a tray in a predetermined location with respect to the engagement members.

23. The apparatus of claim 22 wherein the controllable member is a conveyor.

24. The apparatus of claim 22, further comprising a position sensor to sense the position of the tray and to generate a signal when the tray is positioned in the predetermined location with respect to the engagement members.

* * * * *